(12) United States Patent
Uetake et al.

(10) Patent No.: US 9,595,689 B2
(45) Date of Patent: Mar. 14, 2017

(54) DISPLAY DEVICE AND MANUFACTURING PROCESS OF DISPLAY DEVICE

(71) Applicant: Japan Display Inc., Tokyo (JP)

(72) Inventors: Naoki Uetake, Tokyo (JP); Hiroki Ohara, Tokyo (JP); Toshihiro Sato, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 14/656,888

(22) Filed: Mar. 13, 2015

(65) Prior Publication Data

US 2015/0263315 A1  Sep. 17, 2015

(30) Foreign Application Priority Data

Mar. 14, 2014 (JP) ................. 2014-052600

(51) Int. Cl.
*H01L 29/08* (2006.01)
*H01L 51/52* (2006.01)

(52) U.S. Cl.
CPC ........ *H01L 51/5234* (2013.01); *H01L 51/524* (2013.01); *H01L 51/5225* (2013.01); *H01L 51/5253* (2013.01); *H01L 2251/5315* (2013.01)

(58) Field of Classification Search
CPC ............. H01L 51/5234; H01L 51/5225; H01L 51/524; H01L 51/5253; H01L 2251/5315
USPC ........................................................ 257/40
See application file for complete search history.

(56) References Cited

U.S. PATENT DOCUMENTS

| | | | | |
|---|---|---|---|---|
| 2002/0158568 A1* | 10/2002 | Satake | .................. | H01L 27/322 313/493 |
| 2005/0236975 A1 | 10/2005 | Addington et al. | | |
| 2007/0054430 A1 | 3/2007 | Nishigaki | | |
| 2007/0063648 A1* | 3/2007 | Ogata | .................. | H04M 1/0266 313/512 |
| 2007/0075313 A1* | 4/2007 | Kwak | ................... | H01L 27/124 257/59 |
| 2010/0182222 A1* | 7/2010 | Ichihashi | ............. | G02B 5/1857 345/76 |
| 2013/0273315 A1* | 10/2013 | Mansky | ................... | H01B 7/00 428/138 |
| 2013/0320323 A1 | 12/2013 | Segawa et al. | | |
| 2014/0191266 A1* | 7/2014 | Lee | ....................... | H01L 51/442 257/98 |

FOREIGN PATENT DOCUMENTS

| | | |
|---|---|---|
| JP | 2007-073355 A | 3/2007 |
| JP | 2007-242436 A | 9/2007 |
| JP | 2010003797 A | 1/2010 |
| KR | 10-0744024 B1 | 7/2007 |

OTHER PUBLICATIONS

Korean Office Action mailed on Apr. 27, 2016, for corresponding KR application No. 10-2015-0033775.
Korean Office Action dated Aug. 3, 2016 for corresponding Korean Application No. 10-2015-0033775.

* cited by examiner

*Primary Examiner* — Caleb Henry
(74) *Attorney, Agent, or Firm* — Typha IP LLC

(57) ABSTRACT

A display device includes a substrate, a light emitting layer including one or more kinds of organic light emitting films, a transparent electrode that comes in contact with an upper surface of the light emitting layer, and a glass plate that covers an upper side of the transparent electrode, in which the transparent electrode has a contour corresponding to a contour of the glass plate in a plan view.

3 Claims, 9 Drawing Sheets

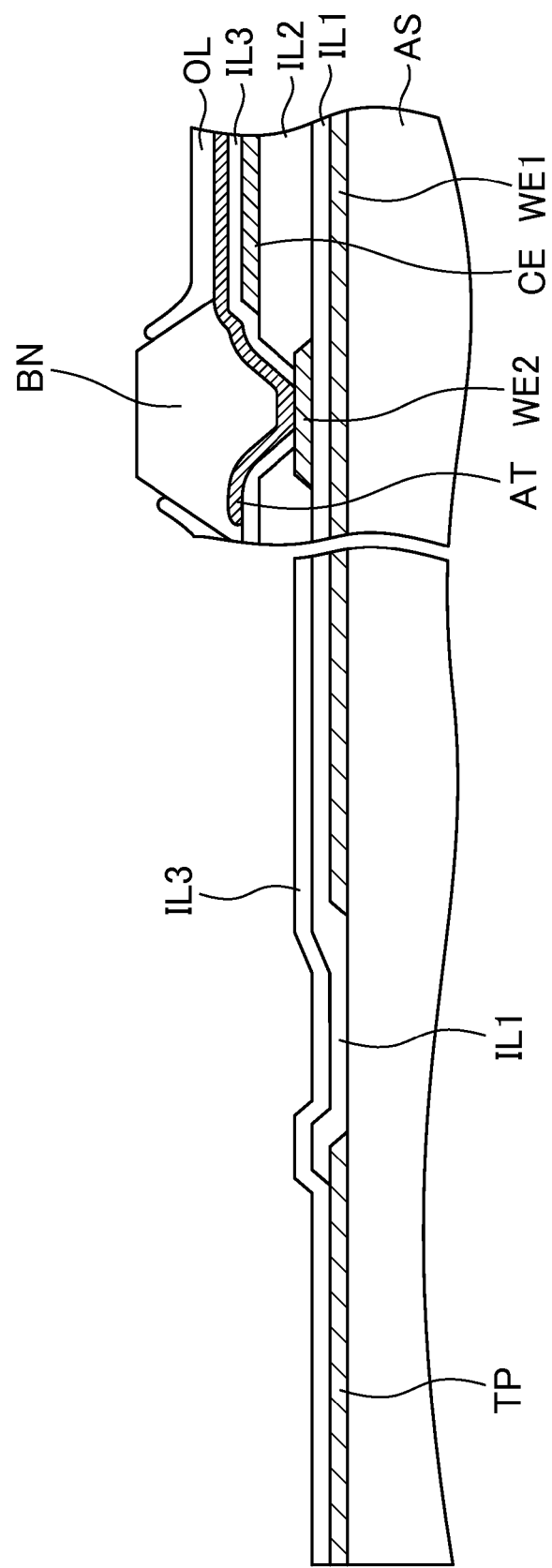

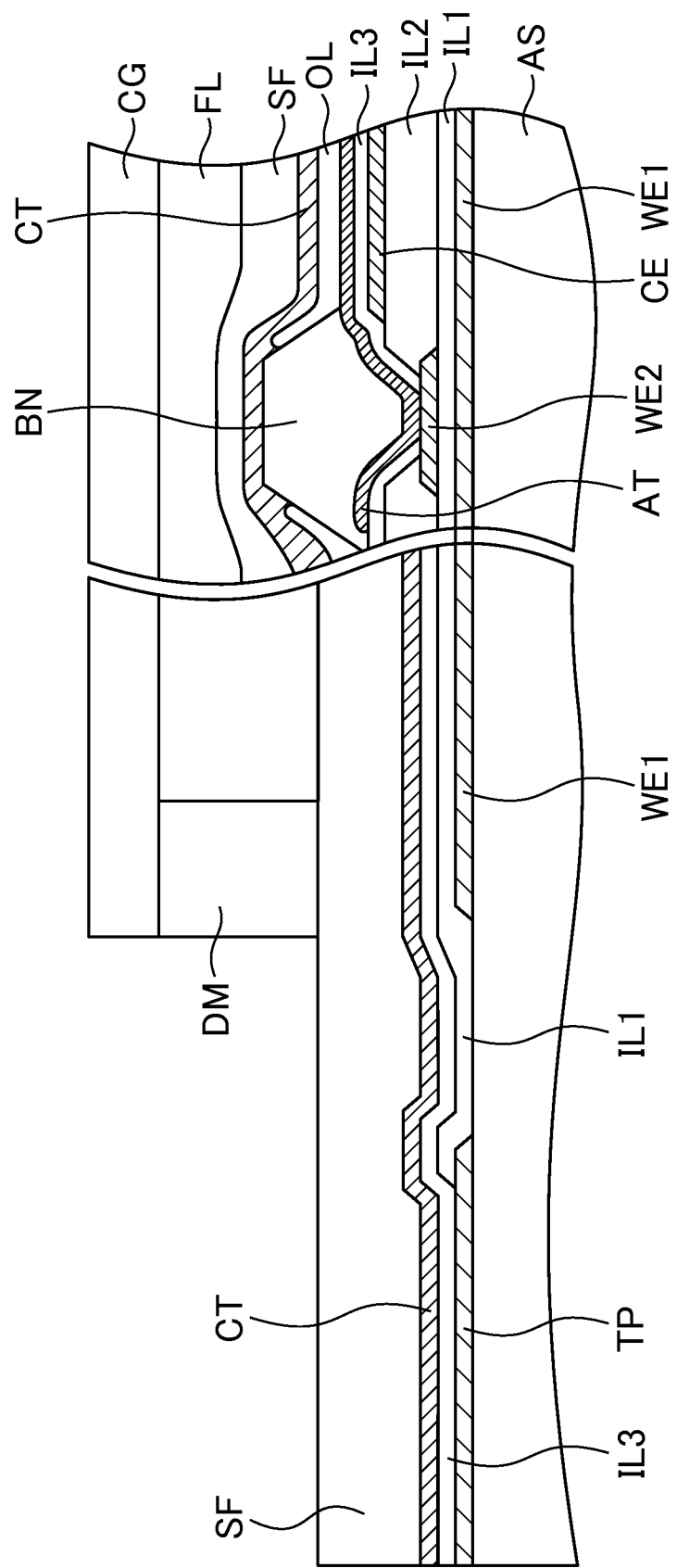

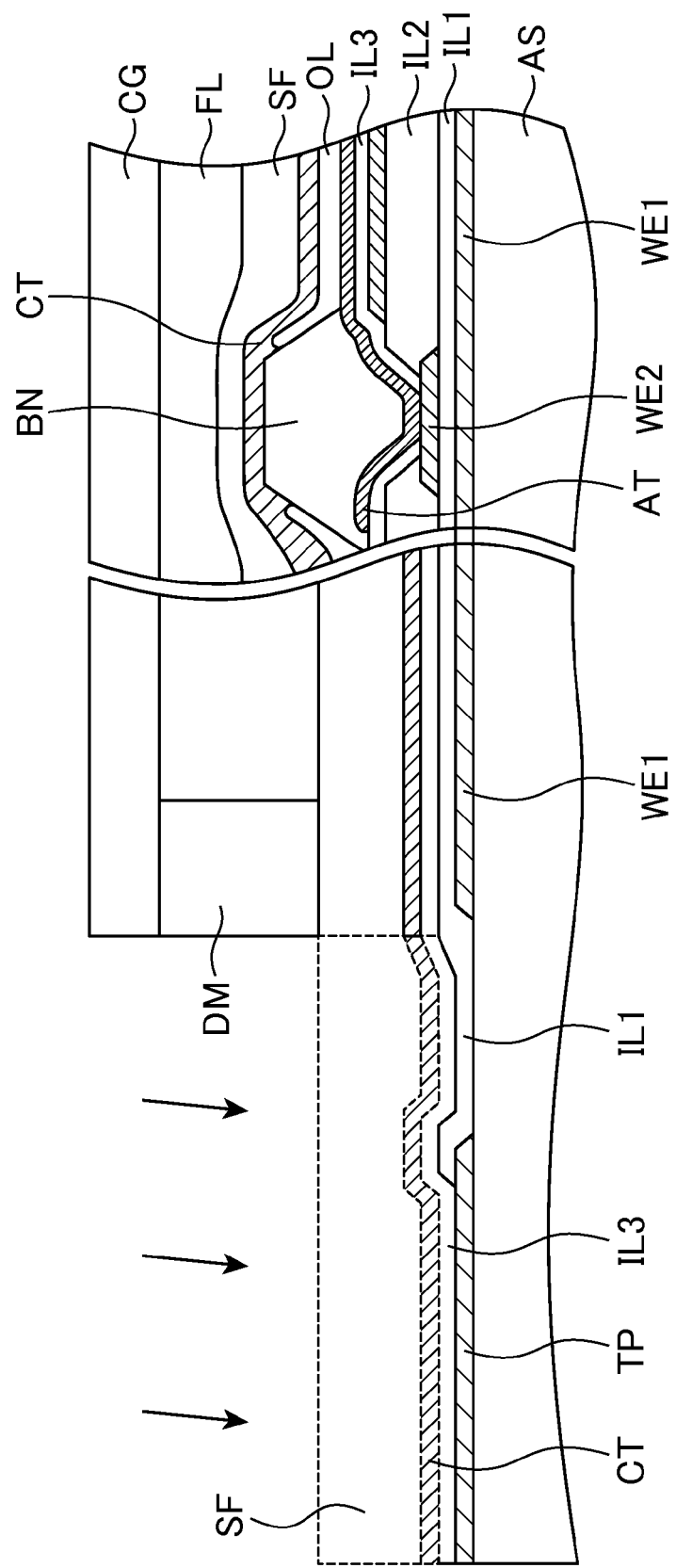

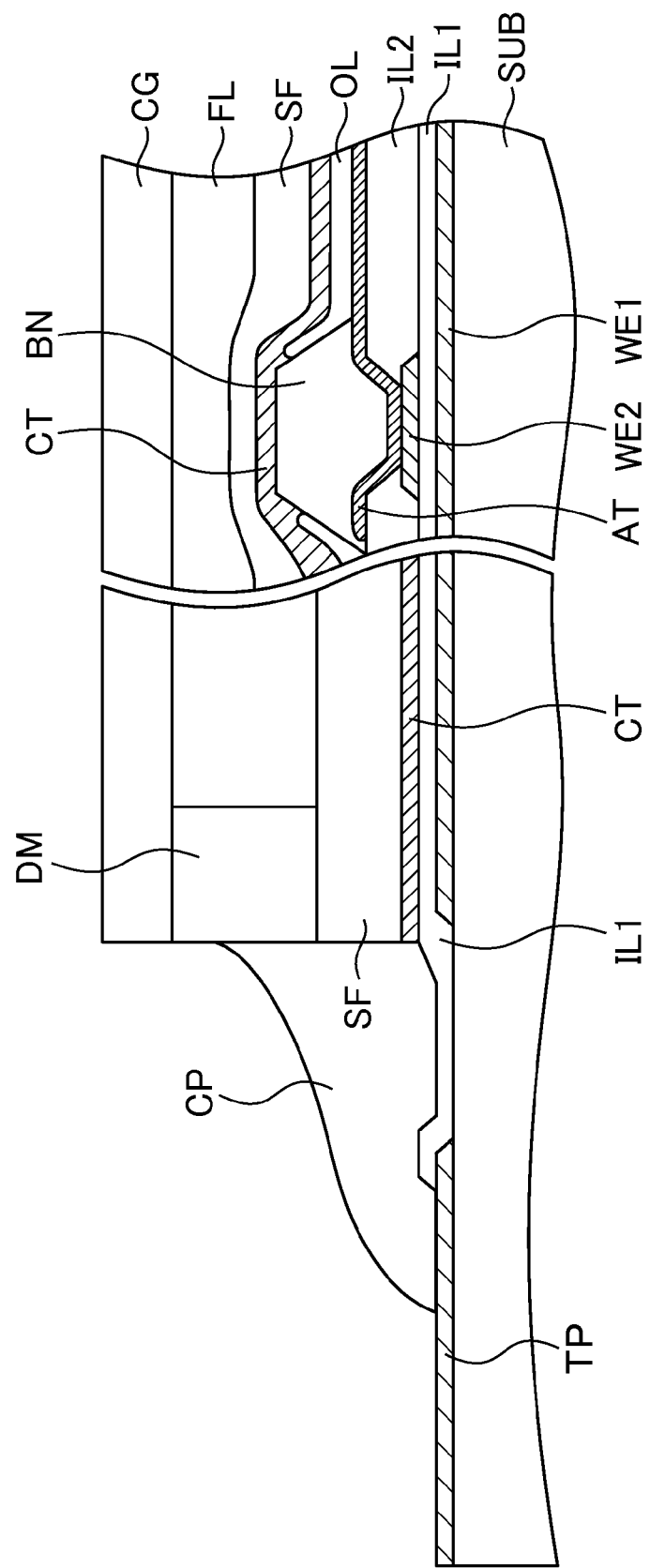

DISPLAY DEVICE AND MANUFACTURING PROCESS OF DISPLAY DEVICE

CROSS-REFERENCE TO RELATED APPLICATION

The present application claims priority from Japanese application JP2014-052600 filed on Mar. 14, 2014, the content of which is hereby incorporated by reference into this application.

BACKGROUND OF THE INVENTION

1. Field of the Invention

The present invention relates to a display device, and a process for manufacturing the display device.

2. Description of the Related Art

In an organic EL (Electro-Luminescence) display device, a transparent electrode is formed on an organic light emitting layer, and a sealing film is further disposed on the transparent electrode. In general, a mask is used in a step of forming the transparent electrode, and the transparent electrode is not formed in an area where terminals are formed.

JP2007-73355A discloses that in manufacturing an organic EL display device in which a second sealing film containing silicon oxide is disposed on a first sealing film made of an organic material, the first sealing film is dry-etched with the second sealing film having an opening as a mask to expose a terminal.

JP2007-242436A discloses that in an organic EL device in which a light emitting organic functional layer, a cathode layer of metal, and a protective member made of epoxy resin are laminated in the stated order, the light emitting organic functional layer is dry-etched with the protective member and the cathode layer as a mask.

SUMMARY OF THE INVENTION

When the transparent electrode is formed with the use of the mask, it is difficult to accurately control a position of the transparent electrode, resulting in a constraint on design. Also, there arises such a problem that the manufacturing cost of the organic EL display device rises.

The invention has been made in view of the above problem, and an object of the invention is to provide a technique of reducing a constraint on the design of the organic EL display device to suppress the manufacturing cost.

A typical outline of the invention disclosed in the present application will be described in brief below.

(1) A display device including: a substrate; a light emitting layer including one or more kinds of organic light emitting films; a transparent electrode that comes in contact with an upper surface of the light emitting layer; and a glass plate that covers an upper side of the transparent electrode, in which the transparent electrode has a contour corresponding to a contour of the glass plate in a plan view.

(2) The display device according to the item (1), in which aside surface of the transparent electrode is placed below aside surface of the glass plate.

(3) The display device according to the item (1) or (2), further including: a sealing film disposed between the glass plate and the transparent electrode.

(4) The display device according to any one of the items (1) to (3), further including: a conductive portion that comes in contact with the side surface of the transparent electrode.

(5) A process for manufacturing a display device, including the steps of: forming a light emitting layer above a substrate; forming a transparent electrode that comes in contact with an upper surface of the light emitting layer; placing a glass plate above the transparent electrode; and etching the transparent electrode with the glass plate as a mask.

(6) The process for manufacturing the display device according to the item (5), further including the step of: forming a sealing film on the transparent electrode after the step of forming the transparent electrode, in which in the step of placing the glass plate, the glass plate is fixed onto the sealing film, and in the step of etching, the sealing film and the transparent electrode are etched with the glass plate as a mask.

According to the invention, a constraint on a design of the display device can be reduced, and a manufacture cost can be suppressed.

BRIEF DESCRIPTION OF THE DRAWINGS

FIG. 3A is a diagram illustrating a step of manufacturing the organic EL display panel illustrated in FIG. 2;

FIG. 3D is a diagram illustrating another step of manufacturing the organic EL display panel illustrated in FIG. 2;

FIG. 3E is a diagram illustrating another step of manufacturing the organic EL display panel illustrated in FIG. 2;

FIG. 4 is a cross-sectional view of another example taken along a line II-II of the organic EL display panel illustrated in FIG. 1.

DETAILED DESCRIPTION OF THE INVENTION

Figure 1:
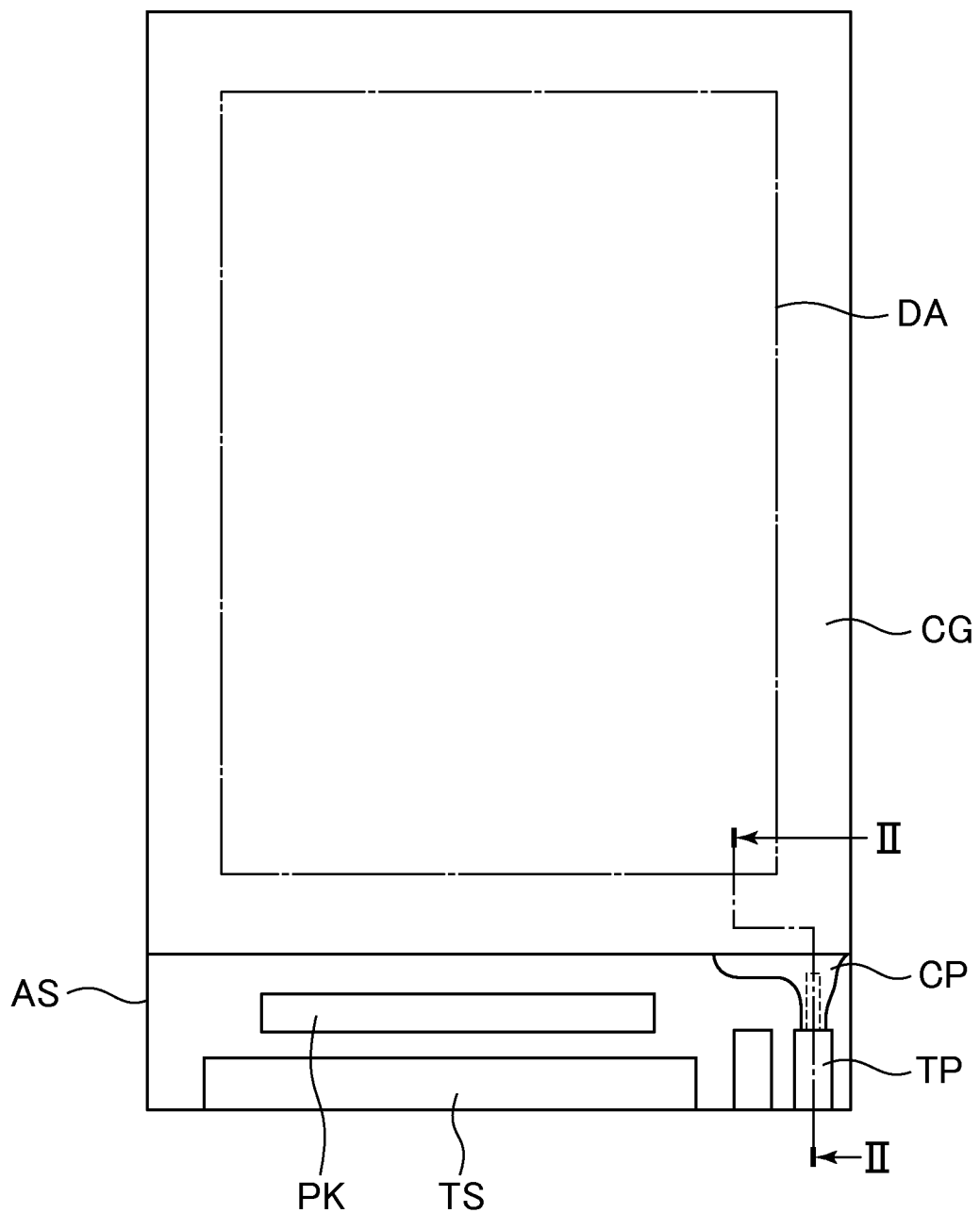
FIG. 1 is a plan view illustrating an example of an organic EL display panel according to an embodiment of the invention.

Hereinafter, embodiments of the invention will be described with reference to the accompanying drawings. Components having the same function are denoted by identical reference characters, and their description will be omitted.

FIG. 1 is a plan view illustrating an example of an organic EL display panel according to an embodiment of the invention. The organic EL display panel includes an array substrate AS and a cover glass CG. The cover glass CG is a transparent glass substrate that faces the array substrate AS. A display area DA in which plural pixel circuits are formed, terminals TS, TP and an integrated circuit package PK are arranged on the array substrate AS. The cover glass CG faces the array substrate AS, and also covers the display area DA and a periphery of the display area DA of an upper surface of the array substrate AS. Also, the cover glass CG does not cover the integrated circuit package PK, and the terminals TS, TP. A ground potential is applied to the terminal TP from the external, and display data indicative of respective display tones of plural pixel circuits, and a signal indicative of scanning timing are input to the terminal TS from the external. The terminal TS is actually formed by plural terminals. A conductive paste CP is coated on the array substrate AS in an area not covered with the cover glass CG between the terminal TP and the cover glass CG in the planar view. Incidentally, color filters having plural sections for converting light output by the organic EL element into colors of red, blue, and green may be formed on the array substrate AS side of the cover glass CG.

Figure 2:
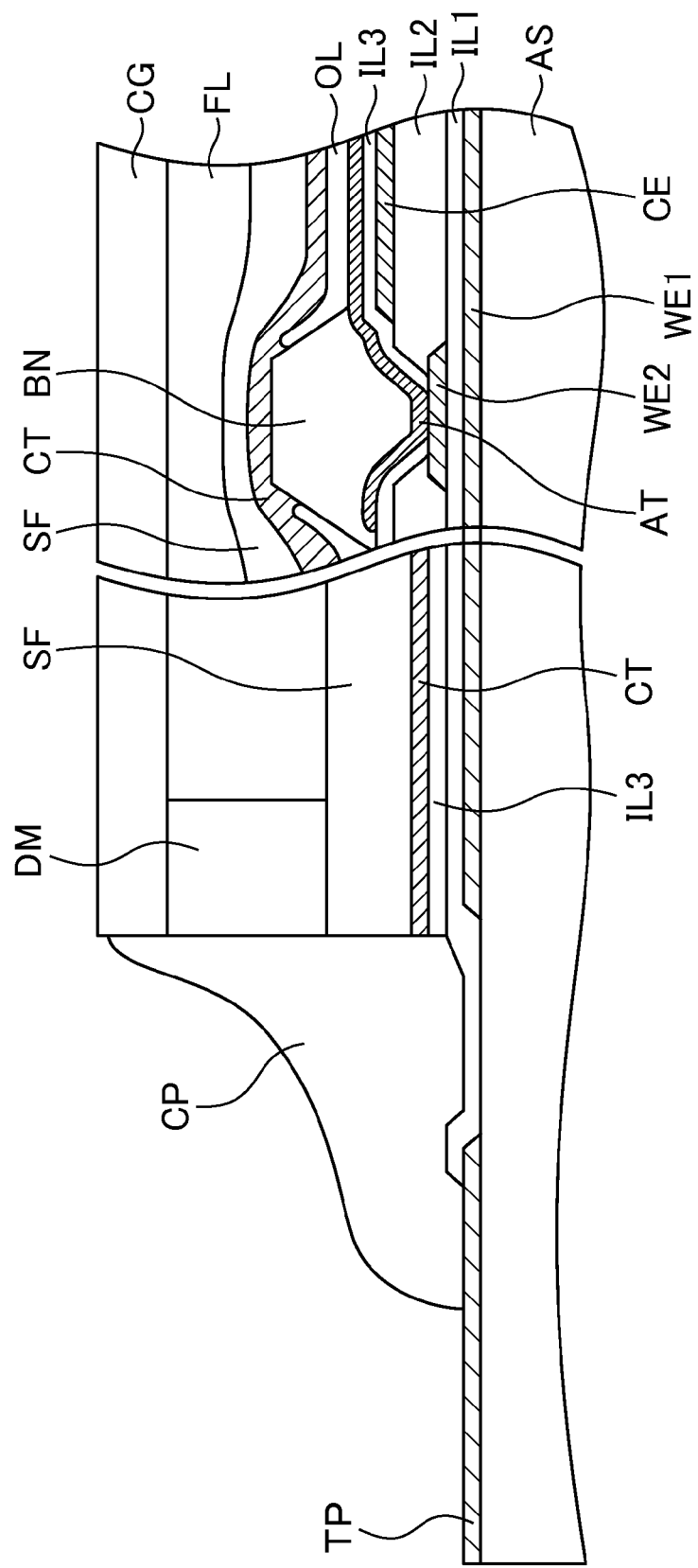
FIG. 2 is a sectional view of one example taken along a line II-II of the organic EL display panel illustrated in FIG. 1.

FIG. 2 is a sectional view of one example taken along a line II-II of the organic EL display panel illustrated in FIG. 1. On the array substrate AS are deposited, in the stated order, a layer in which a first line WE1 and the terminals TP, TS are formed, a first insulating layer IL1, a layer in which a second line WE2 is formed, a second insulating layer IL2, a layer in which a capacitive electrode CE is formed, a third insulating layer IL3, a layer in which an anode electrode AT is formed, a layer in which a bank BN is formed, an organic light emitting layer OL, a layer in which a cathode electrode CT is formed, and a sealing film SF. Further, on an upper surface of the sealing film SF, a dam DM is disposed in a portion overlapping with an edge of the color filter glass CG in the planar view, and an inside of the dam DM is filled with a filler FL. The cover glass CG is fixed onto the dam DM and the filler FL. The terminal TP and the first line WE1 are spaced apart from each other, and insulated from each other by the first insulating layer IL1.

The anode electrode AT, the organic light emitting layer OL, and the cathode electrode CT form an organic EL element, and the anode electrode AT is formed in each of the pixel circuits. The organic EL element outputs white light of an intensity corresponding to a current supplied from the anode electrode AT. The anode electrode AT comes in contact with the second line WE2 in a bottom of a contact hole, and the second line WE2 is connected to a thin film transistor not shown. Also, the bank BN is disposed to partition the organic EL element into the respective pixel circuits in the planar view, and the anode electrode AT does not come in contact with the organic light emitting layer OL in an area where the bank BN is present. The cathode electrode CT is one sheet of conductive film that covers the organic light emitting layers OL in the plural pixel circuits, and an upper surface of the cathode electrode CT is covered with the sealing film SF. Although not particularly restricted, the organic light emitting layer OL may have a structure in which a hole injection layer, a hole transport layer, a light emitting layer, an electron transport layer, and an electron injection layer are deposited from the anode electrode AT side toward the cathode electrode CT side. The light emitting layer may have a structure in which different materials are arranged in each place of the display area DA for emitting light of blue, red, and green, or may have a structure in which the same material is arranged not depending on the places of the display area DA.

The layers from the layer of the second line WE2 to the layer of the sealing film SF are present below the cover glass CG, and those layers are not present in an area except for a lower portion of the cover glass CG. A side surface of the sealing film SF, a side surface of the cathode electrode CT and a side surface of the third insulating layer IL3 are present below an end surface of the cover glass CG. Also, in order to electrically connect the terminal TP and the cathode electrode CT, the conductive paste CP is coated on a part of an area on the terminal TP side from the cover glass CG.

The shapes of the sealing film SF and the cathode electrode CT are substantially identical with the shape of the cover glass CG, and correspond to the shape of the cover glass CG. A difference in the shape between the cover glass CG, and the sealing film SF as well as the cathode electrode CT is caused by only the manufacturing process.

FIGS. 3A to 3E are diagrams illustrating the manufacturing steps of the organic EL display panel illustrated in FIG. 2. In manufacturing the organic EL display panel, a metal film is first formed on the array substrate AS that is a glass substrate, and the film is patterned to form the terminals TP, TS, and the first line WE1. Then, an insulating material such as an organic insulating material is formed thereon, and the formed film is patterned to form the first insulating layer IL1. A film of semiconductor not shown is formed on the first insulating layer IL1, and the film is patterned. Then, a metal film is formed and patterned to form the second line WE2. Then, a film of the organic insulating material is formed, and the film is patterned to form the second insulating layer IL2. The second insulating layer IL2 also functions as a planarizing film for suppressing an influence of the roughness of the underlying layer.

Then, a metal film is formed on the second insulating layer IL2, and the film is patterned to form the capacitive electrode CE. Then, a film of an inorganic insulating material mainly containing SiN is formed on an upper layer of the capacitive electrode CE, and patterned to form the third insulating layer IL3.

A conductive film made of, for example, ITO (indium tin oxide) is formed on the third insulating layer IL3, and the film is patterned to form the anode electrode AT. Then, the bank BN mainly containing organic material is formed in an area mainly present between the organic EL elements.

In a next step, the organic light emitting layer OL is formed (refer to FIG. 3A). In the step of forming the organic light emitting layer OL, the operation of evaporating various materials such as an organic light emitting material is repeated plural times while changing the materials. In this embodiment, the organic light emitting layer OL is deposited for each of the pixel circuits with the use of a mask. Alternatively, the organic light emitting layer OL may be deposited on the overall surface without using the mask.

In a next step, the cathode electrode CT is formed. In this step, a transparent electrode made of, for example, IZO (indium zinc oxide) is formed, through a sputtering method, on the array substrate AS on which the organic light emitting layer OL is deposited. Also, in this step, in forming the cathode electrode CT, the cathode electrode CT is deposited with vapor deposition on the overall surface of the array substrate AS without using the mask (refer to FIG. 3B).

Figure 3B:
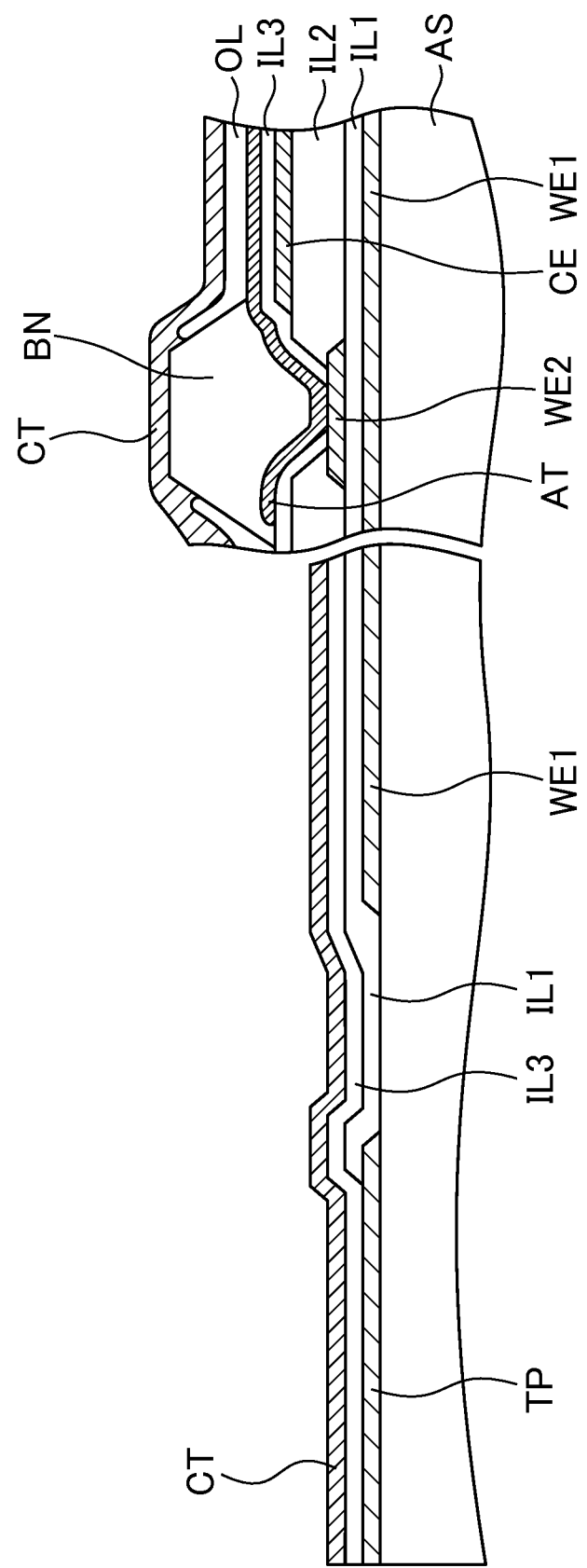
FIG. 3B is a diagram illustrating another step of manufacturing the organic EL display panel illustrated in FIG. 2.
Figure 3C:
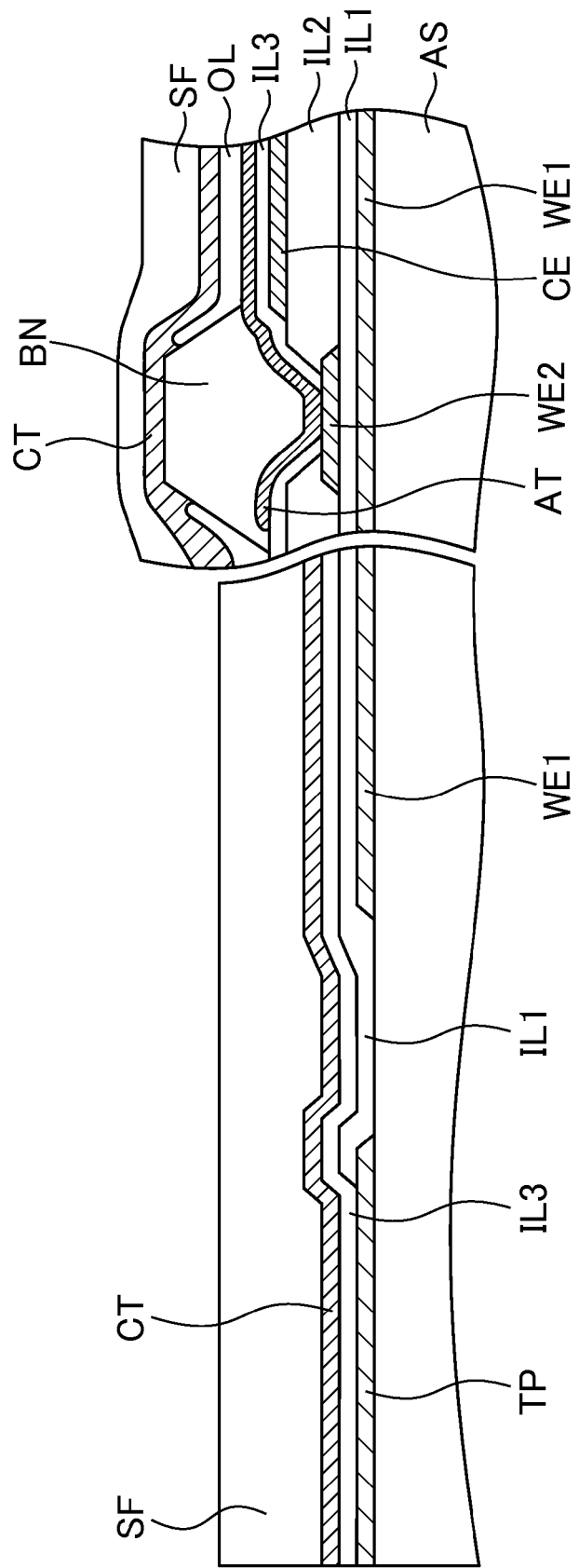
FIG. 3C is a diagram illustrating another step of manufacturing the organic EL display panel illustrated in FIG. 2.

In a next step, the sealing film SF is formed on the film of the cathode electrode CT (refer to FIG. 3C). The sealing film SF includes, for example, three layers of a layer of at least one layer containing SiN, a layer of acrylic, and a layer of SiN, and in this step, those three layers are deposited in order to form the sealing film SF. Also, the sealing film SF is not patterned at this time. Incidentally, because acrylic is likely to stay in a stepped area, acrylic hardly exists in a flat area such as a left end of FIG. 3C.

In a next step, the dams DM are placed at positions corresponding to square sides of an edge of the cover glass CG on the sealing film SF, and an inside of the dam DM is filled with the filler FL. Then, the cover glass CG is fixed onto the dam DM and the filler FL (refer to FIG. 3D).

In a next step, the sealing film SF and the cathode electrode CT are removed through an etching method such as dry etching with the cover glass CG as a mask (refer to FIG. 3E). As a result, portions of the sealing film SF, the cathode electrode CT, and the third insulating layer IL3, which are not present below the cover glass CG, are removed, and upper surfaces of the terminals TP and TS are exposed so that a flexible printed board can be connected onto the terminals TP and TS. Also, the sealing film SF and the cathode electrode CT present below the cover glass CG remain without being removed due to etching with the cover glass CG as the mask. Thereafter, the conductive paste CP of a conductive property is coated thereon. An exposed portion of the first insulating layer IL1 from the cover glass CG also remains in etching with the cover glass CG as the mask. The first insulating layer IL1 is configured to cover an end of the terminal TP. With this configuration, even when the terminal TP is remarkably close to the end of the cover glass CG, the cathode electrode CT and the terminal TP can be prevented from being undesirably electrically connected from each other due to variation in the etching. Since the cross-sectional surface illustrated in FIGS. 3A to 3E shows a portion connected with the conductive paste CP, electric connection may be made, but it is problematic that the terminal TP for video signals is connected to the cathode electrode CT. This situation can be avoided by the structure of the first insulating layer IL1.

As described above, the portions of the sealing film SF and the cathode electrode CT which are present outside the cover glass CG and which are in layers present above the organic light emitting layer OL, are removed with the cover glass CG as the mask, thereby making it unnecessary to use the mask in forming the cathode electrode CT. Without the use of the mask, the costs associated with the preparation and replacement of the mask can be reduced, and also a material adhered to the mask is not mixed into the array substrate AS that is being manufactured. The material is a foreign matter with the result that the occurrence of a defective product can be suppressed. Also, in the case of using the mask, there is a need to have a margin in the circuit arrangement so that short circuit or connection failure does not occur in conjunction with the positioning precision of the mask. On the other hand, in this embodiment, there is no need to consider the positioning precision, and an increase in the degree of freedom in the design and a reduction in a frame area can be performed. Also, since the cover glass CG does not transmit gas or chemicals used for etching, if the cover glass CG is used as the mask, damage to the organic light emitting layer OL included in each pixel circuit is also suppressed.

Also, because the side surface of the cathode electrode CT is not covered with the sealing film SF, the side surface and the terminal TP can be electrically connected to each other by the conductive paste CP. As a result, there is no need to form the contact hole for electric connection below the cover glass CG, and the degree of freedom in design of the circuit arrangement increases.

Incidentally, the structure of the cross-section of each pixel circuit may be different from that illustrated in FIG. 2. For example, the capacitive electrode CE and the third insulating layer IL3 may not be provided. FIG. 4 is a cross-sectional view of another example taken along a line II-II of the organic EL display panel illustrated in FIG. 1. In an example of FIG. 4, because the arrangement of a capacitor in each pixel circuit is different from that in FIG. 1, the capacitive electrode CE and the third insulating layer IL3 are not provided. Even with this difference, a positional relationship between the cathode electrode CT as well as the sealing film SF, and the cover glass CG is identical with that in the example of FIG. 2, and the same effects as those in the example of FIG. 2 can be obtained.

Figure 5:
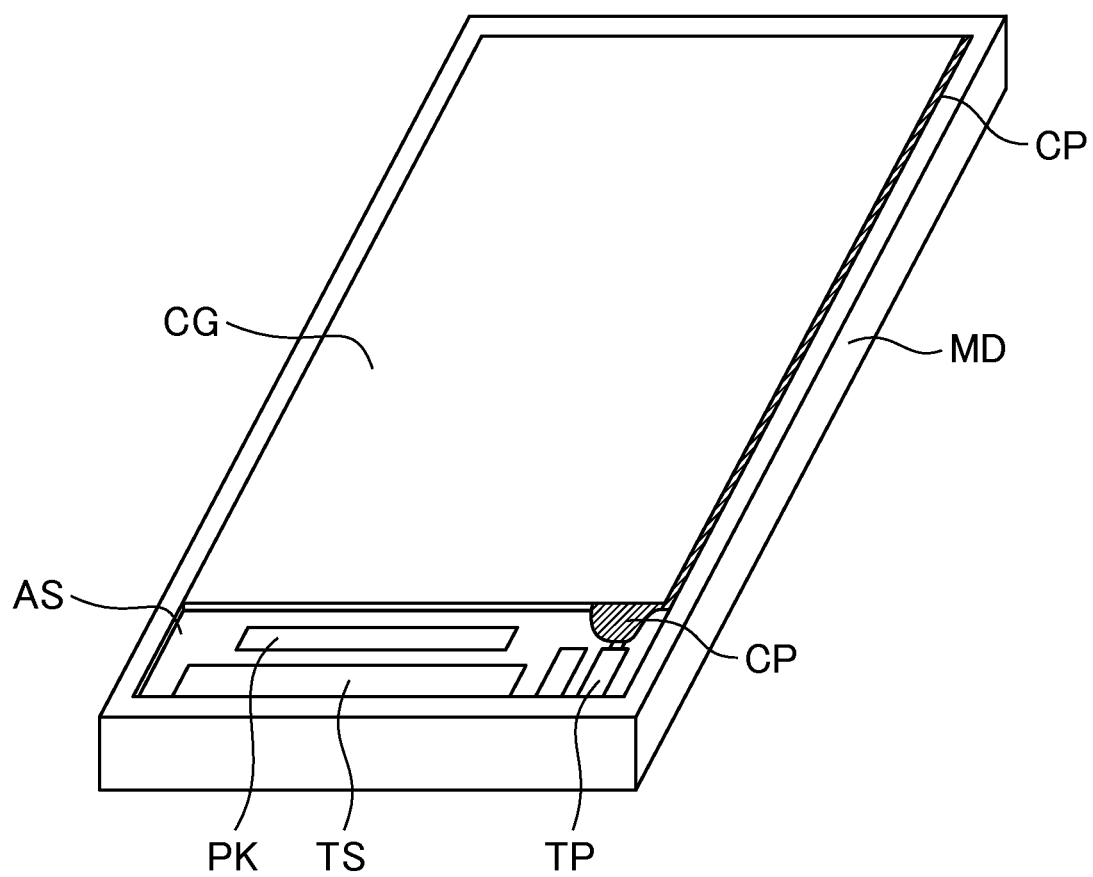
FIG. 5 is a perspective view illustrating another example of the organic EL display panel.

Incidentally, the conductive paste CP that connects the terminal TP and the cathode electrode CT may be disposed in not only a portion of the side of the terminal side of the cathode electrode CT in the planar view, but also a portion of a side orthogonally connected to that side. FIG. 5 is a perspective view illustrating another example of the organic EL display panel. In the cathode electrode CT that is rectangular in the planar view, the conductive paste CP is so arranged as to come in contact with not only a side surface of the cathode electrode CT on the front side in FIG. 5, but also a side surface of the cathode electrode CT on the right side in FIG. 5. Also, a mold MD surrounds the array substrate AS on which the conductive paste CP is arranged. In this way, the conductive paste CP is brought into contact with a side surface of the cathode electrode CT other than the side surface of the terminal side whereby the cathode electrode CT can be surely connected to the terminal TP, and a resistance between the cathode electrode CT and the terminal TP can be reduced.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
   a substrate;
   a light emitting layer including one or more kinds of organic light emitting films;
   a transparent electrode that comes in contact with an upper surface of the light emitting layer;
   a glass plate that covers an upper side of the transparent electrode; and
   a conductive portion which is on an outer side of the glass plate in a plan view and in contact with the side surface of the transparent electrode both physically and electrically,
   wherein the transparent electrode has a contour corresponding to a contour of the glass plate in the plan view, and
   wherein in the plan view, a shape of the transparent electrode is identical with a shape of the glass plate.

2. The display device according to claim 1, wherein a side surface of the transparent electrode is placed below a side surface of the glass plate.

3. The display device according to claim 1, further comprising:
   a sealing film disposed between the glass plate and the transparent electrode.

* * * * *